(12) United States Patent
Sharpe-Geisler

(10) Patent No.: US 12,732,191 B2
(45) Date of Patent: Sep. 8, 2026

(54) HIGH-SPEED MULTI-MODE LOGIC BLOCK WITH COMBINED OUTPUTS FOR PROGRAMMABLE LOGIC DEVICES

(71) Applicant: Lattice Semiconductor Corporation, Hillsboro, OR (US)

(72) Inventor: Bradley A. Sharpe-Geisler, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 18/641,172

(22) Filed: Apr. 19, 2024

(65) Prior Publication Data

US 2025/0330178 A1 Oct. 23, 2025

(51) Int. Cl.
*H03K 19/173* (2006.01)
*G06F 30/392* (2020.01)
*H03K 19/17728* (2020.01)

(52) U.S. Cl.
CPC ....... *H03K 19/1737* (2013.01); *G06F 30/392* (2020.01); *H03K 19/17728* (2013.01)

(58) Field of Classification Search
CPC ............... H03K 19/17; H03K 19/1737; H03K 19/17728; H03K 17/51; H03K 17/62; H03K 17/693; H03K 17/735; H03K 17/76; G06F 30/392
See application file for complete search history.

(56) References Cited

U.S. PATENT DOCUMENTS 6,107,822 A * 8/2000 Mendel ............ H03K 19/17728 326/39
6,480,023 B1 * 11/2002 Kaviani ............. H03K 19/1737 326/38
6,980,026 B1 * 12/2005 Trimberger ...... H03K 19/17728 326/40
9,602,108 B1 * 3/2017 Gaide .............. H03K 19/17744
9,658,830 B1 * 5/2017 Padalia ............ H03K 19/17728
9,716,491 B2 7/2017 Sharpe-Geisler
2004/0145942 A1 * 7/2004 Leijten-Nowak ............................ H03K 19/1737 365/154
2006/0232296 A1 * 10/2006 Wang ............... H03K 19/17736 326/40
2015/0347642 A1 * 12/2015 Chatterjee ............... G06F 30/34 716/102
2016/0246571 A1 * 8/2016 Walters, III ........... G06F 7/5057
2020/0150925 A1 * 5/2020 Greene .................... G06F 7/506
2022/0376693 A1 * 11/2022 Greene ............ H03K 19/17728

(Continued)

*Primary Examiner* — Jason M Crawford
(74) *Attorney, Agent, or Firm* — Haynes and Boone, LLP

(57) ABSTRACT

Embodiments of the present disclosure include improved logic blocks with combined outputs for programmable logic devices and methods of operating and programming these logic blocks. In an exemplary aspect, a programmable logic device (PLD) is described. In some embodiments, the PLD includes a logic block. The logic block may include a first look-up table (LUT) circuit configured to generate a first output; a second LUT circuit configured to generate a second output; a ripple logic circuit configured to receive the first output and the second output and generate a third output; and a three-to-one multiplexer circuit configured to receive the first output, the second output, and the third output and selectively produce an output of the logic block.

20 Claims, 11 Drawing Sheets

(56) References Cited

U.S. PATENT DOCUMENTS

2023/0216503 A1* 7/2023 Singh ............... H03K 19/17728
326/38
2025/0330178 A1* 10/2025 Sharpe-Geisler ..... G06F 30/392

* cited by examiner

HIGH-SPEED MULTI-MODE LOGIC BLOCK WITH COMBINED OUTPUTS FOR PROGRAMMABLE LOGIC DEVICES

TECHNICAL FIELD

The present disclosure relates generally to programmable logic devices (PLDs) and, more particularly, to PLDs having improved logic block configurations.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, user designs are synthesized and mapped into configurable resources (e.g., programmable logic gates, look-up tables (LUTs), embedded hardware, or other types of resources) and interconnections available in particular PLDs. Physical placement and routing for the synthesized and mapped user designs may then be determined to generate configuration data for the particular PLDs.

A PLD may include a number of programmable logic blocks (PLBs) and configurable routing resources that may be used to interconnect the PLBs. Logic block design involves complex tradeoffs among various quantities, such as area, speed, cost, and functionality. For example, PLBs that support different combinational modes may have multiple output ports and associated circuit paths and components devoted to the various modes, which have associated cost in terms of delay, area, and routing resources. There remains a need for PLBs that provide multiple modes while at the same time reducing delay and routing complexity.

SUMMARY

Embodiments of the present disclosure include improved logic blocks with combined outputs for programmable logic devices and methods of operating and programming these logic blocks.

In an exemplary aspect, a PLD is described. In some embodiments, the PLD includes a logic block. The logic block may include a first LUT circuit configured to generate a first output; a second LUT circuit configured to generate a second output; a ripple logic circuit configured to receive the first output and the second output and generate a third output; and a three-to-one multiplexer circuit configured to receive the first output, the second output, and the third output and selectively produce an output of the logic block.

In another exemplary aspect, a method of operating a logic block within a PLD is described. In some embodiments, the method may include generating, by a first LUT circuit, a first output; generating, by a second LUT circuit, a second output; generating, by a ripple logic circuit, a third output from the first output and the second output; receiving the first output, the second output, and the third output; and generating an output of the logic block based on the first output, the second output, and the third output, wherein the receiving and the generating are performed by a three-to-one multiplexer circuit.

In another exemplary aspect, a method of programming a PLD is described. In some embodiments, the PLD includes a plurality of programmable logic blocks (PLBs). Each of the plurality of PLBs may include a first LUT circuit configured to generate a first output; a second LUT circuit configured to generate a second output; a ripple logic circuit configured to receive the first output and the second output and generate a third output; and a multiplexer circuit configured to selectively place the PLB in a LUT mode or a ripple mode by selecting one of the first output, the second output, and the third output as an output of the PLB. The method of programming may include generating configuration data to configure physical components of the PLD in accordance with a synthesized design comprising, for each PLB, one of the LUT mode or the ripple mode; and programming the PLD with the configuration data.

Additional aspects, features, and advantages of the present disclosure will become apparent from the following detailed description.

BRIEF DESCRIPTION OF THE DRAWINGS

The accompanying drawing figures incorporated in and forming a part of this specification illustrate several aspects of the disclosure, and together with the description, serve to explain the principles of the disclosure.

DETAILED DESCRIPTION

Figure 1:
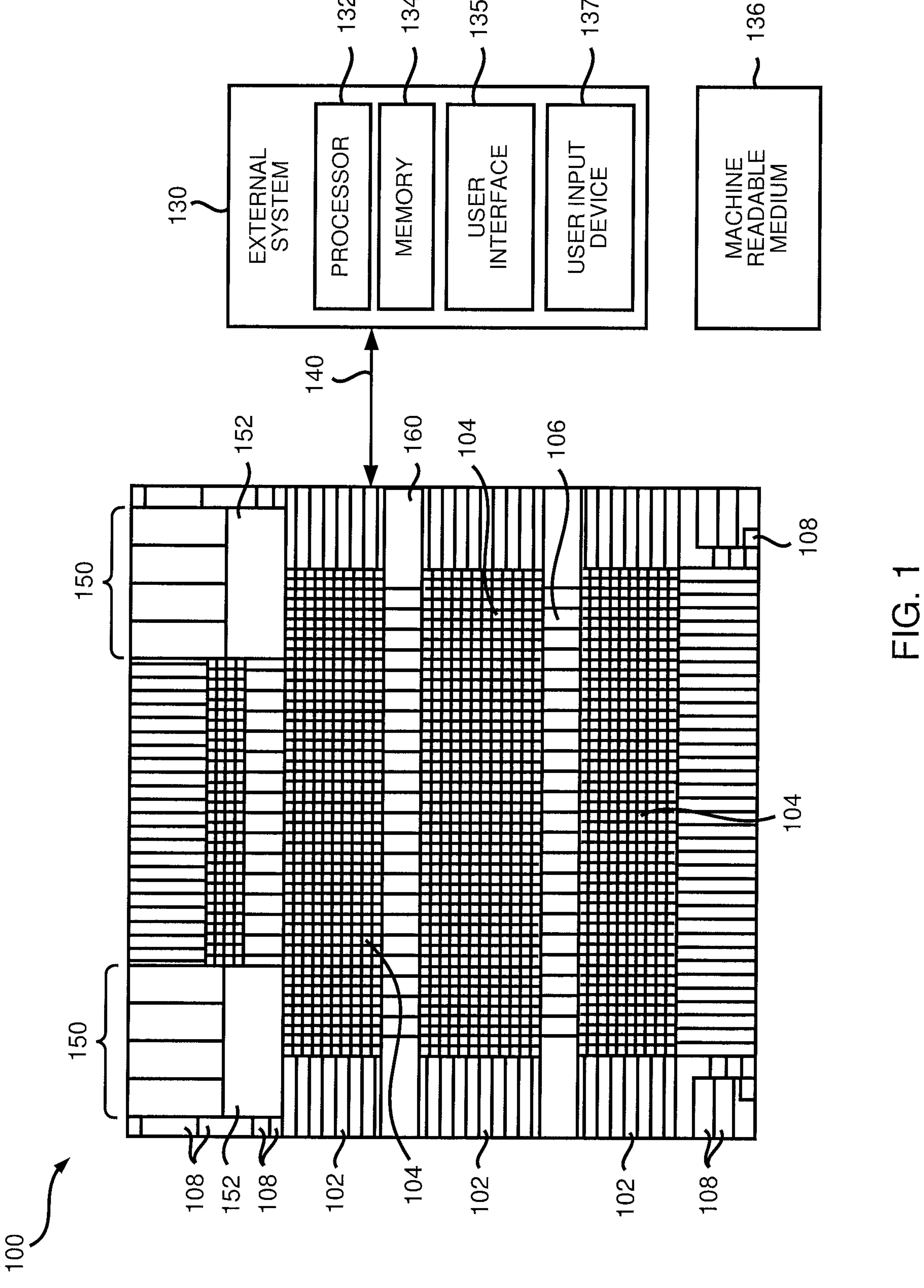
FIG. 1 illustrates a block diagram of a programmable logic device (PLD) in accordance with some aspects of the present disclosure.

For the purpose of promoting an understanding of the principles of the present disclosure, reference will now be made to the embodiments illustrated in the drawings, and specific language will be used to describe the same. It is nevertheless understood that no limitation to the scope of the disclosure is intended. Any alterations and further modifications to the described devices, systems, and methods, and any further application of the principles of the present disclosure are fully contemplated and included within the present disclosure as would normally occur to one skilled in the art to which the disclosure relates. In particular, it is fully contemplated that the features, components, and/or steps described with respect to one embodiment may be combined with the features, components, and/or steps described with respect to other embodiments of the present disclosure. For the sake of brevity, however, the numerous iterations of these combinations will not be described separately.

A PLD may include various logic blocks, each of which supports multiple combinatorial modes. For example, a conventional logic block may support a n-input LUT (LUTn or nLUT) mode (F), a SUM mode (FS), and a mode that dynamically selects between two LUTn's using an additional input M (an extended logic or OFS mode). In addition, the conventional logic block may include an additional output port (Q) that is a registered (stored) version of a combinatorial mode or of the independent input (M). This example conventional logic block illustrates a need to minimize the number of output ports while still providing high performance.

This disclosure recognizes that various combinatorial modalities in a logic block may be combined into a single output without compromising performance of a LUTn mode. This may be accomplished by combining other modes in parallel with the last stage of the LUTn itself, thereby eliminating an intermediate multiplexer and other intermediate logic, such as inverters, in a logic block. Various embodiments illustrating these techniques are presented and further explained herein.

FIG. 1 illustrates a block diagram of a programmable logic device (PLD) 100 in accordance with some aspects of the present disclosure. The PLD 100 may be an FPGA, a CPLD, an FPSC, or other type of programmable device. The PLD 100 generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while logic blocks 104 provide logic functionality (e.g., LUT-based logic or logic gate array-based logic) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock sources, PLL circuits, and/or DLL circuits), and/or various routing resources (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, certain I/O blocks 102 may be used for programming memory 106 or transferring information (e.g., various types of user data and/or control signals) to/from PLD 100. Other I/O blocks 102 include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, I/O blocks 102 may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104, hard IP blocks 160, and routing resources to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may provide such configuration data to one or more I/O blocks 102, SERDES blocks 150, and/or other portions of PLD 100. As a result, logic blocks 104, various routing resources, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, system 130 may run PLD configuration software, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100.

Figure 2:
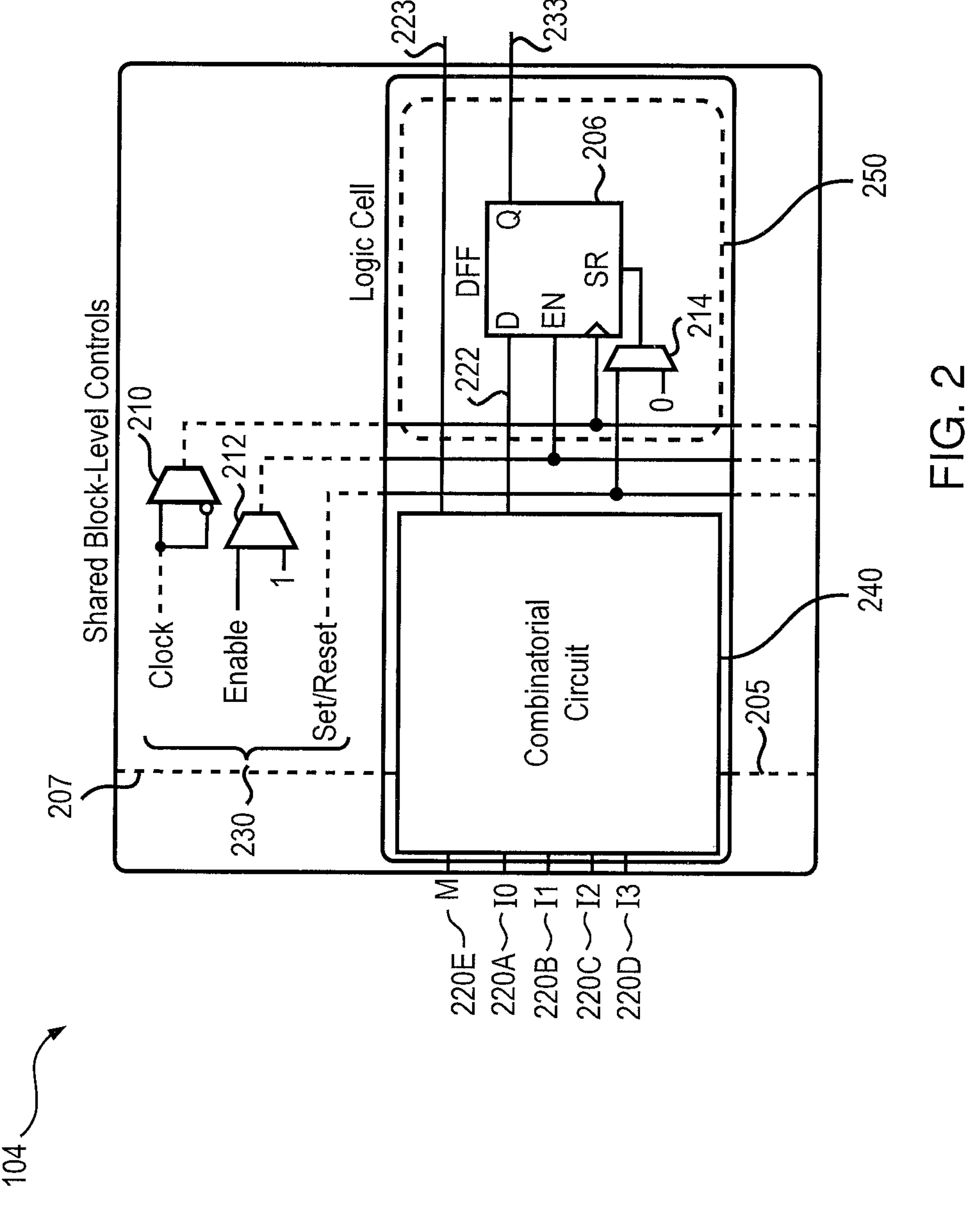
FIG. 2 illustrates a block diagram of a logic block 104 of PLD 100 in accordance with some aspects of the present disclosure.

FIG. 2 illustrates a block diagram of a logic block 104 of PLD 100 in accordance with some aspects of the present disclosure. As discussed, PLD 100 includes a plurality of logic blocks 104 including various components to provide logic and arithmetic functionality.

In the example embodiment shown in FIG. 2, logic block 104 may be interconnected to other logic blocks using routing resources. Each logic block 104 includes a combinatorial circuit 240 and a register circuit 250. In more detail, each logic block 104 may include various components such as: one or more lookup tables (LUTs), mode logic circuitry, a register 206 (e.g., a flip-flop or latch), and various programmable multiplexers (e.g., programmable multiplexers 212 and 214) for selecting desired signal paths for logic block 104 and/or between logic blocks 104. In this example, combinatorial circuit 240 accepts four inputs 220A-220D. The combinatorial circuit 240 may implement or include a four-input LUT (which may be abbreviated as "4LUT" or "LUT4") that can be programmed by configuration data for PLD 100 to implement any appropriate logic operation having four inputs or less. Combinatorial circuit 240 may include various logic elements and/or additional inputs, such as input 220E, to support the functionality of the various modes, as described herein. A LUT within combinatorial circuit 240 may be of any other suitable size having any other suitable number of inputs for a particular implementation of a PLD. In some embodiments, different size LUTs may be provided for different logic blocks 104. Various more detailed embodiments of combinatorial circuits 240 are presented herein starting with FIG. 4.

An output signal 222 from combinatorial circuit 240 may in some embodiments be passed through register 206 to provide an output signal 233 of logic block 104. In various embodiments, an output signal 223 from combinatorial circuit 240 may be passed to output 223 directly, as shown. Depending on the configuration of multiplexers 210-214 and/or mode logic within the combinatorial circuit 240, output signal 222 may be temporarily stored (e.g., latched) in register 206 according to control signals 230. In some embodiments, configuration data for PLD 100 may configure output 223 and/or 233 of logic block 104 to be provided as one or more inputs of another logic block 104 (e.g., in another logic block or the same logic block) in a staged or cascaded arrangement (e.g., comprising multiple levels) to configure logic operations that cannot be implemented in a single logic block 104 (e.g., logic operations that have too many inputs to be implemented by a single LUT). Moreover, logic block 104 may be implemented with multiple outputs and/or interconnections to facilitate selectable modes of operation, as described herein.

The combinatorial circuit 240 may include mode logic circuitry that may be utilized for some configurations of PLD 100 to efficiently implement arithmetic operations such as adders, subtractors, comparators, counters, or other operations, to efficiently form some extended logic operations (e.g., higher order LUTs, working on multiple bit data), to efficiently implement a relatively small RAM, and/or to allow for selection between logic, arithmetic, extended logic, and/or other selectable modes of operation. In this regard, logic circuits across multiple logic blocks 104, may be chained together to pass carry-in signals 205 and carry-out signals 207, and/or other signals (e.g., output signals 222) between adjacent logic blocks 104, as described herein. In some embodiments, logic circuits within combinatorial circuit 240 may be chained across multiple logic blocks 104. More detailed embodiments are provided in FIGS. 9-12.

Logic block 104 illustrated in FIG. 2 is merely an example, and logic blocks 104 according to different embodiments may include different combinations and arrangements of PLD components. Each of the logic blocks 104 may be used to implement a portion of a user design implemented by PLD 100. In this regard, PLD 100 may include many logic blocks 104, which are used to collectively implement the user design.

Figure 3:
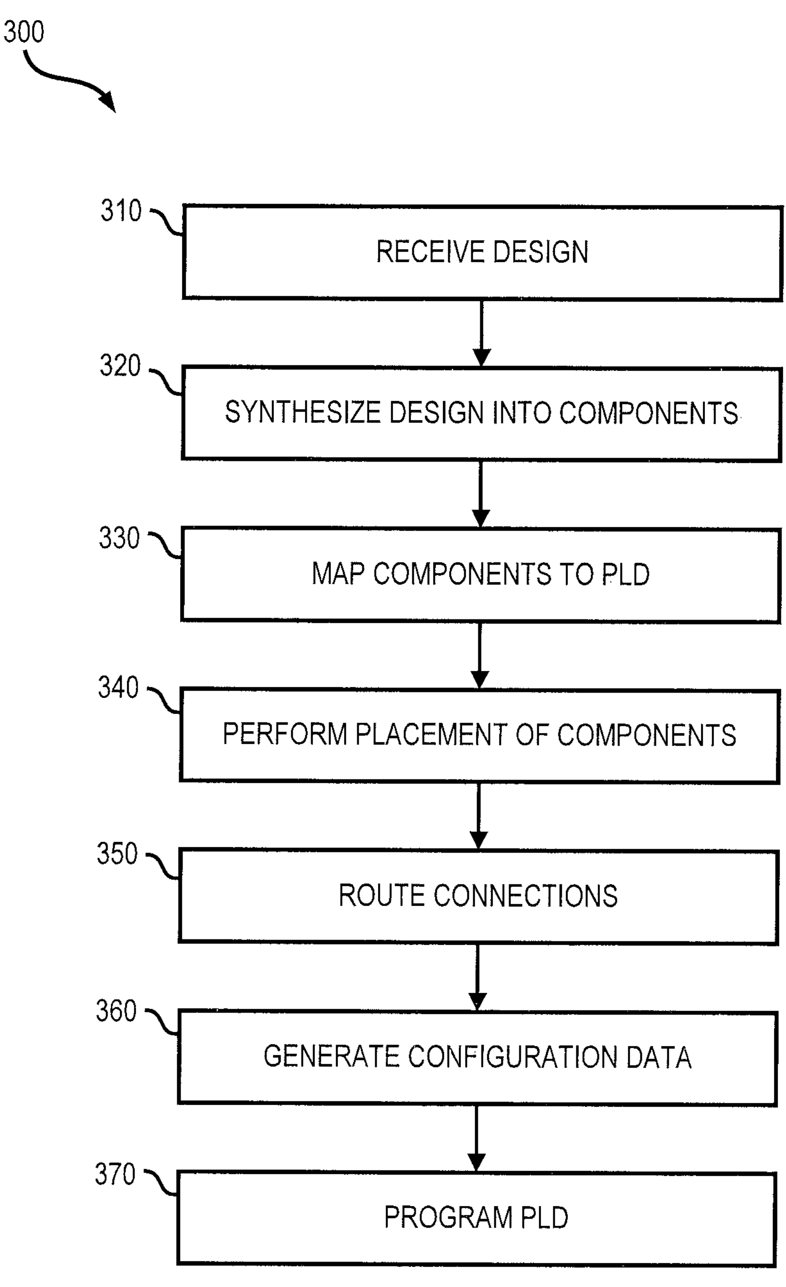
FIG. 3 illustrates a design process for a PLD, in accordance with some aspects of the present disclosure.

FIG. 3 illustrates a design process 300 for a PLD, in accordance with some aspects of the present disclosure. For example, the process of FIG. 3 may be performed by system 130 running Lattice Diamond software to configure PLD 100. In some embodiments, the various files and information referenced in FIG. 3 may be stored, for example, in one or more databases and/or other data structures in memory 134, machine readable medium 136, and/or otherwise.

In operation 310, system 130 receives a user design that specifies the desired functionality of PLD 100. For example, the user may interact with system 130 (e.g., through user input device 137 and hardware description language (HDL) code representing the design) to identify various features of the user design (e.g., high level logic operations, hardware configurations, and/or other features). In some embodiments, the user design may be provided in a register transfer level (RTL) description (e.g., a gate level description). System 130 may perform one or more rule checks to confirm that the user design describes a valid configuration of PLD 100. For example, system 130 may reject invalid configurations and/or request the user to provide new design information as appropriate.

In operation 320, system 130 synthesizes the design to create a netlist (e.g., a synthesized RTL description) identifying an abstract logic implementation of the user design as a plurality of logic components (e.g., also referred to as netlist components). In some embodiments, the netlist may be stored in Electronic Design Interchange Format (EDIF) in a Native Generic Database (NGD) file.

In some embodiments, synthesizing the design into a netlist in operation 320 may involve converting (e.g., translating) the high-level description of logic operations, hardware configurations, and/or other features in the user design into a set of PLD components (e.g., logic blocks 104 and other components of PLD 100 configured for logic, arithmetic, or other hardware functions to implement the user design) and their associated interconnections or signals. Depending on embodiments, the converted user design may be represented as a netlist.

In some embodiments, synthesizing the design into a netlist in operation 320 may further involve performing an optimization process on the user design (e.g., the user design converted/translated into a set of PLD components and their associated interconnections or signals) to reduce propagation delays, consumption of PLD resources and routing resources, and/or otherwise optimize the performance of the PLD when configured to implement the user design. Depending on embodiments, the optimization process may be performed on a netlist representing the converted/translated user design. Depending on embodiments, the optimization process may represent the optimized user design in a netlist (e.g., to produce an optimized netlist).

In some embodiments, the optimization process may include optimizing certain instances of a logic function operation, a ripple arithmetic operation, and/or an extended logic function operation which, when a PLD is configured to implement the user design, would occupy a plurality of configurable PLD components (e.g., logic blocks 104 and/or routing resources). For example, the optimization process may include detecting multiple mode or configurable logic blocks implementing logic function operations, ripple arithmetic operations, extended logic function operations, and/or corresponding routing resources in the user design, interchanging operational modes of logic blocks implementing the various operations to reduce the number of PLD components and/or routing resources used to implement the operations and/or to reduce the propagation delay associated with the operations, and/or reprogramming corresponding LUTs and/or mode logic to account for the interchanged operational modes.

In another example, the optimization process may include detecting extended logic function operations and/or corresponding routing resources in the user design, implementing the extended logic operations into multiple mode or convertible logic blocks with single physical logic block outputs, routing or coupling the logic block outputs of a first set of logic blocks to the inputs of a second set of logic blocks to reduce the number of PLD components used to implement the extended logic operations and/or routing resources and/or to reduce the propagation delay associated with the extended logic operations, and/or programming corresponding LUTs and/or mode logic to implement the extended logic function operations with at least the first and second sets of logic blocks.

In another example, the optimization process may include detecting multiple mode or configurable logic blocks implementing logic function operations, ripple arithmetic operations, extended logic function operations, and/or corresponding routing resources in the user design, interchanging operational modes of logic blocks implementing the various operations to provide a programmable register along a signal path within the PLD to reduce propagation delay associated with the signal path, and reprogramming corresponding LUTs, mode logic, and/or other logic block control bits/registers to account for the interchanged operational modes and/or to program the programmable register to store or latch a signal on the signal path.

In operation 330, system 130 performs a mapping process that identifies components of PLD 100 that may be used to implement the user design. In this regard, system 130 may map the optimized netlist (e.g., stored in operation 320 as a result of the optimization process) to various types of components provided by PLD 100 (e.g., logic blocks 104, embedded hardware, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 320 to produce a netlist that is mapped to PLD components.

In operation 340, system 130 performs a placement process to assign the mapped netlist components to particular physical components residing at specific physical locations of the PLD 100 (e.g., assigned to particular logic blocks 104, routing resources, and/or other physical components of PLD 100), and thus determine a layout for the PLD 100. In some embodiments, the placement may be performed on one or more previously stored NCD files, with the placement results stored as another physical design file.

In operation 350, system 130 performs a routing process to route connections (e.g., using routing resources) among the components of PLD 100 based on the placement layout determined in operation 340 to realize the physical interconnections among the placed components. In some embodiments, the routing may be performed on one or more previously stored NCD files, with the routing results stored as another physical design file.

In various embodiments, routing the connections in operation 350 may further involve performing an optimization process on the user design to reduce propagation delays, consumption of PLD resources and/or routing resources, and/or otherwise optimize the performance of the PLD when configured to implement the user design. The optimization process may in some embodiments be performed on a physical design file representing the converted/translated user design, and the optimization process may represent the optimized user design in the physical design file (e.g., to produce an optimized physical design file).

In some embodiments, the optimization process may include optimizing certain instances of a logic function operation, a ripple arithmetic operation, and/or an extended logic function operation which, when a PLD is configured to implement the user design, would occupy a plurality of configurable PLD components (e.g., logic blocks 104, and/or routing resources). For example, the optimization process may include detecting multiple mode or configurable logic blocks implementing logic function operations, ripple arithmetic operations, extended logic function operations, and/or corresponding routing resources in the user design, interchanging operational modes of logic blocks implementing the various operations to reduce the number of PLD components and/or routing resources used to implement the operations and/or to reduce the propagation delay associated with the operations, and/or reprogramming corresponding LUTs and/or mode logic to account for the interchanged operational modes.

In another example, the optimization process may include detecting extended logic function operations and/or corresponding routing resources in the user design, implementing the extended logic operations into multiple mode or convertible logic blocks with single physical logic block outputs, routing or coupling the logic block outputs of a first set of logic blocks to the inputs of a second set of logic blocks to reduce the number of PLD components used to implement the extended logic operations and/or routing resources and/or to reduce the propagation delay associated with the extended logic operations, and/or programming corresponding LUTs and/or mode logic to implement the extended logic function operations with at least the first and second sets of logic blocks.

In another example, the optimization process may include detecting multiple mode or configurable logic blocks implementing logic function operations, ripple arithmetic operations, extended logic function operations, and/or corresponding routing resources in the user design, interchanging operational modes of logic blocks implementing the various operations to provide a programmable register along a signal path within the PLD to reduce propagation delay associated with the signal path, and reprogramming corresponding LUTs, mode logic, and/or other logic block control bits/registers to account for the interchanged operational modes and/or to program the programmable register to store or latch a signal on the signal path.

Changes in the routing may be propagated back to prior operations, such as synthesis, mapping, and/or placement, to further optimize various aspects of the user design.

Thus, following operation 350, one or more physical design files may be provided which specify the user design after it has been synthesized (e.g., converted and optimized), mapped, placed, and routed (e.g., further optimized) for PLD 100 (e.g., by combining the results of the corresponding previous operations). In operation 360, system 130 generates configuration data for the synthesized, mapped, placed, and routed user design. In operation 370, system 130 configures PLD 100 with the configuration data by, for example, loading a configuration data bitstream into PLD 100 over connection 140.

Figure 4:
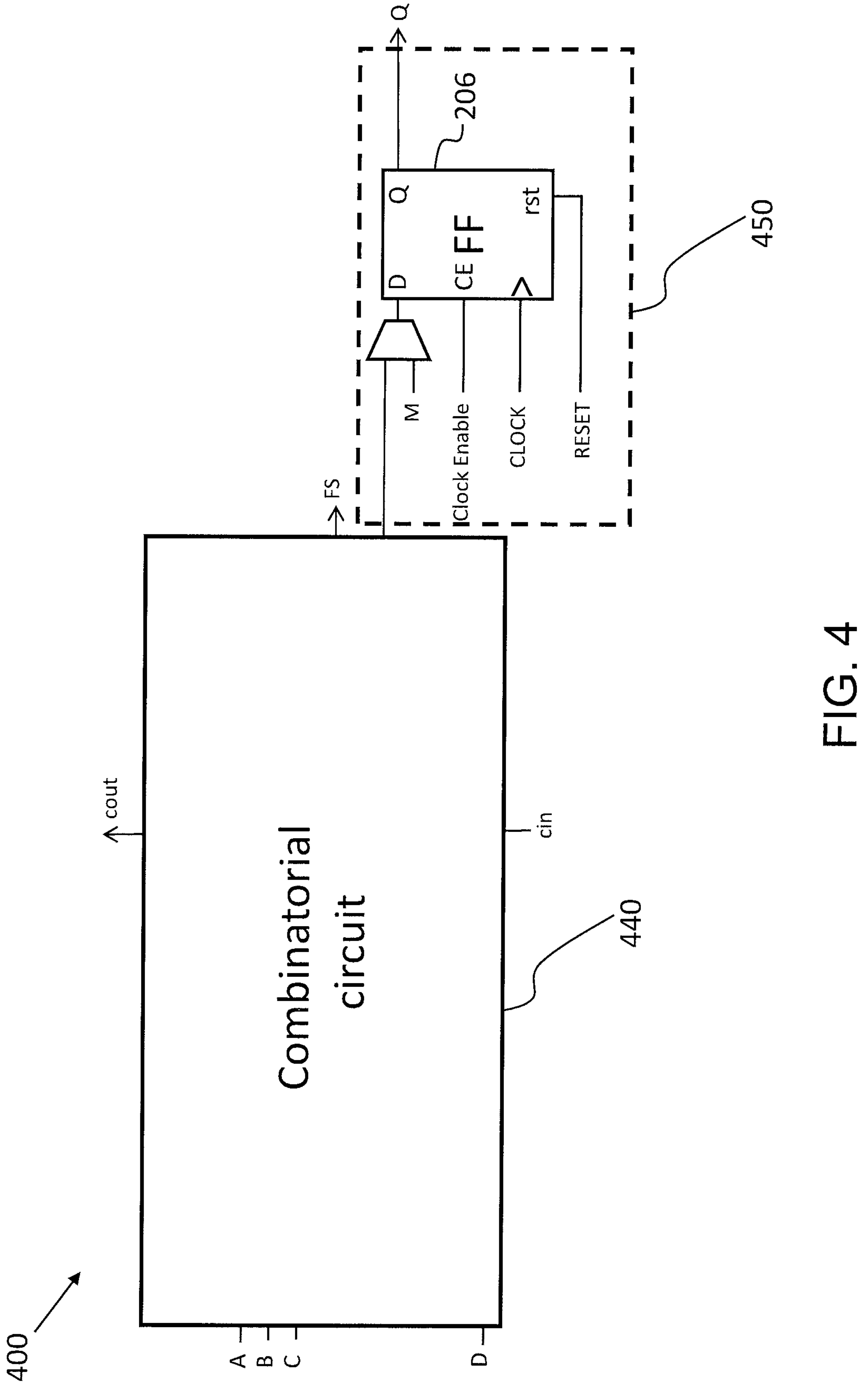
FIG. 4 illustrates an example PLB, according to some aspects of the present disclosure.

FIG. 4 illustrates an example logic block 400, such as logic block 104, according to some aspects of the present disclosure. The logic block 400 includes a combinatorial part or circuit 440 coupled to a register part or circuit 450 as shown.

In this logic block 400, two combinatorial modes are combined into a single FS output. Logic block 400 supports two combinatorial modes: (1) FS in 4LUT mode (by selecting F) can support any 4-input combinatorial function of the A, B, C, D inputs; (2) FS in ripple mode can support a variety of ripple functions of one output bit (such as add, subtract, multiply, increment), along with carry to the next bit. The logic block 400 register circuit (output Q) 450 supports sequential functions. The logic block 400 illustrates a baseline logic block which serves as a comparison for improvements to logic blocks presented herein.

Hereafter, it is assumed that every logic block has both a combinatorial part and a register part (as exemplified in FIGS. 2 and 4). The focus of the remainder of this disclosure is on the combinatorial part, so the register circuit 450 is not illustrated in the remaining figures. It is also assumed that distributed RAM may also be supported, but that functionality is known and not made explicit in the figures.

Figure 5:
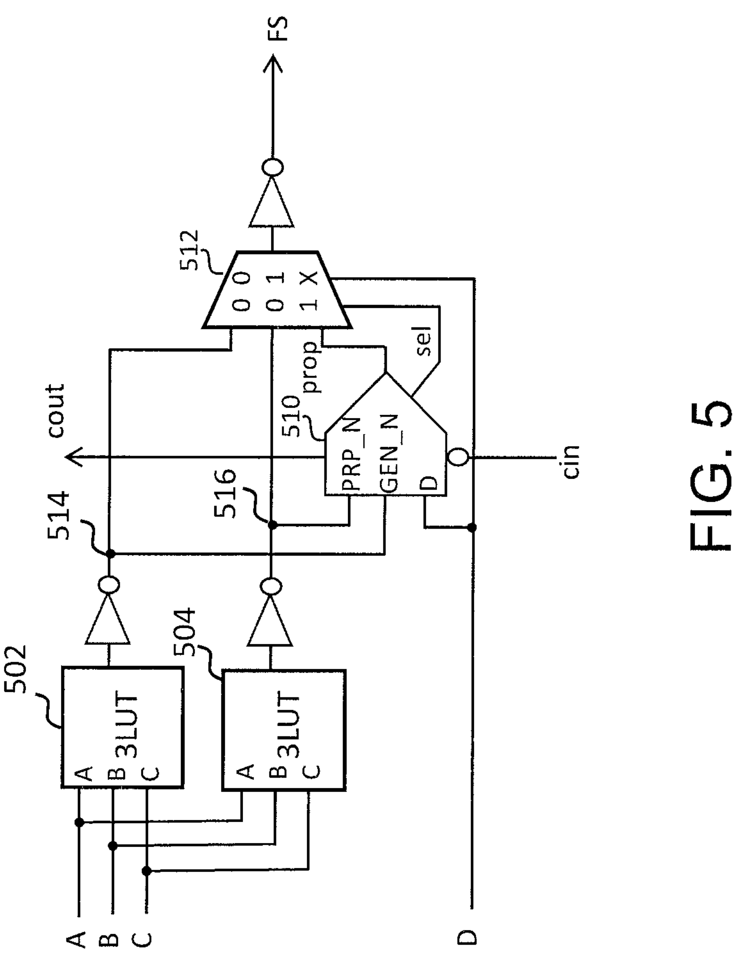
FIG. 5 illustrates an example combinatorial circuit of a PLB, according to some aspects of the present disclosure.
Figure 5:
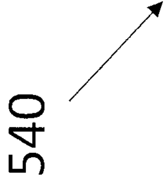

FIG. 5 illustrates an example combinatorial circuit 540 of a logic block, such as logic block 104, according to some aspects of the present disclosure. The combinatorial circuit 540 includes 3LUTs 502, 504, a ripple circuit 510, and a three-to-one (sometimes abbreviated as 3:1 or 3-to-1) multiplexer (MUX) 512. Each 3LUT 502, 504 is in series with a corresponding inverter as shown, a 3LUT in series with an inverter represents an example 3LUT circuit. The output signals 514, 516 of the 3LUTs 510, 512, respectively, (after inversion in this example) are provided both to the multiplexer 512 and the ripple circuit 510 (inputs labeled PRP_N and GEN_N, respectively). The ripple circuit in turn may generate an output (labeled "prop") provided as an input to the multiplexer 512 and a select signal ("sel") used to select the multiplexer 512 output.

A truth table of the multiplexer 512 is illustrated, where, in this example, if sel=1, the output of multiplexer 512 is the output of the ripple circuit 510 (labeled "prop") regardless of the value of the input D. If sel=0, then input D is used to select one of the LUT inputs as the output of the multiplexer 512. In other words, when in a logic or LUT mode, the prop input is ignored (sel=0) and the multiplexer 512 behaves as a simple 2-to-1 multiplexer controlled by the D input to select one of the 3LUT outputs 514, 516, which provides 4LUT functionality (and may also be referred to as a LUT mode or 4LUT mode). When ripple logic is enabled, sel will be responsive to cin and select the signal labeled "prop" as appropriate for ripple functionality. Configuration bits, which may be set during a design process, such as the design process in FIG. 3, may determine the "sel" bit and set the mode in which the combinatorial circuit 540 exists (e.g., LUT mode or ripple mode).

A conventional combinatorial circuit includes two 3LUTs, such as 502 and 504, that feed into a 2-to-1 multiplexer. The output of multiplexer is selectable by input D to provide 4LUT functionality. A conventional combinatorial circuit also includes a ripple circuit that can support a variety of ripple functions of one output bit along with an output carry signal cout. The combinatorial circuit 540 has a same or a similar functionality as a conventional combinatorial circuit, but without the drawback of the added delay of an additional multiplexer and buffer. Instead, a ripple mode is introduced in parallel with a final stage 2-to-1 multiplexer of the LUT4, making it a 3-to-1 multiplexer 512. Thus, the LUT circuit outputs 514, 516 and the ripple logic circuit output "prop" may be received simultaneously by the multiplexer 512.

Figure 6:
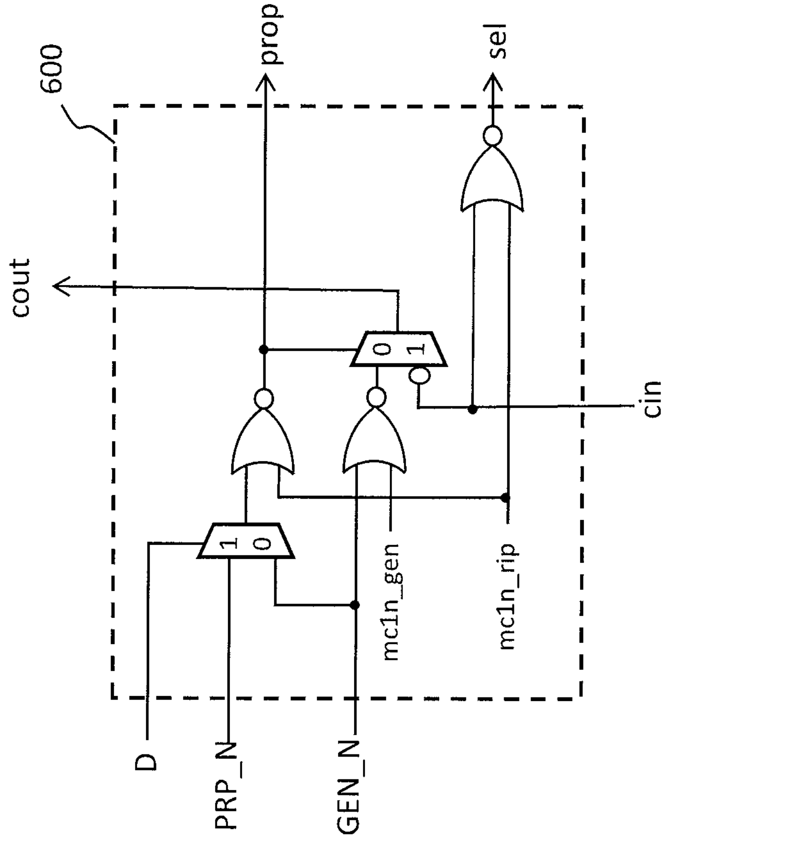
FIG. 6 illustrates an example embodiment of a ripple circuit, according to some aspects of the disclosure.

FIG. 6 illustrates an example embodiment of a ripple circuit 600, such as ripple circuit 510 in FIG. 5, according to some aspects of the disclosure. Note that the nomenclature for signals herein is that a signal ending in "n" means the signal is active low. Although not shown in FIG. 6, the ripple circuit 600 example here illustrates the use of configuration bits labeled as mc1n_gen and mc1n_rip. mc1n_gen may represent a binary generate control signal provided from a generate register (not shown), and mc1n_rip may represent a binary ripple control signal provided from a ripple register (not shown).

Figure 7:
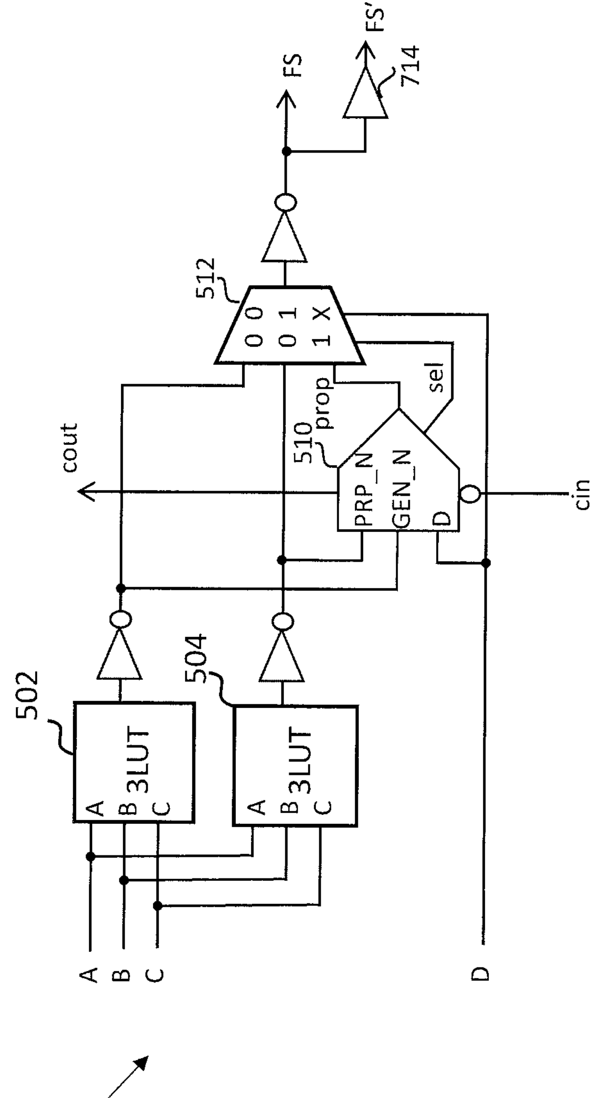
FIG. 7 illustrates an example combinatorial circuit of a PLB, according to some aspects of the disclosure.

FIG. 7 illustrates an example combinatorial circuit 740 of a logic block, such as logic block 104, according to some aspects of the disclosure. The combinatorial circuit 740 is similar to combinatorial circuit 540 of FIG. 5, but provides a means for favoring certain destinations for higher performance. The FS output is used for speed-critical destinations. The FS' output is generated by buffering the FS output using buffer 714 to handle higher fanout loads, e.g., that connect over longer distances within a PLD. Both FS and FS' outputs are functionally identical in all modes and therefore they can both be used in all modes. Routing then only needs to support a single combinatorial output constituted of the combined destinations of FS and FS'.

Figure 8:
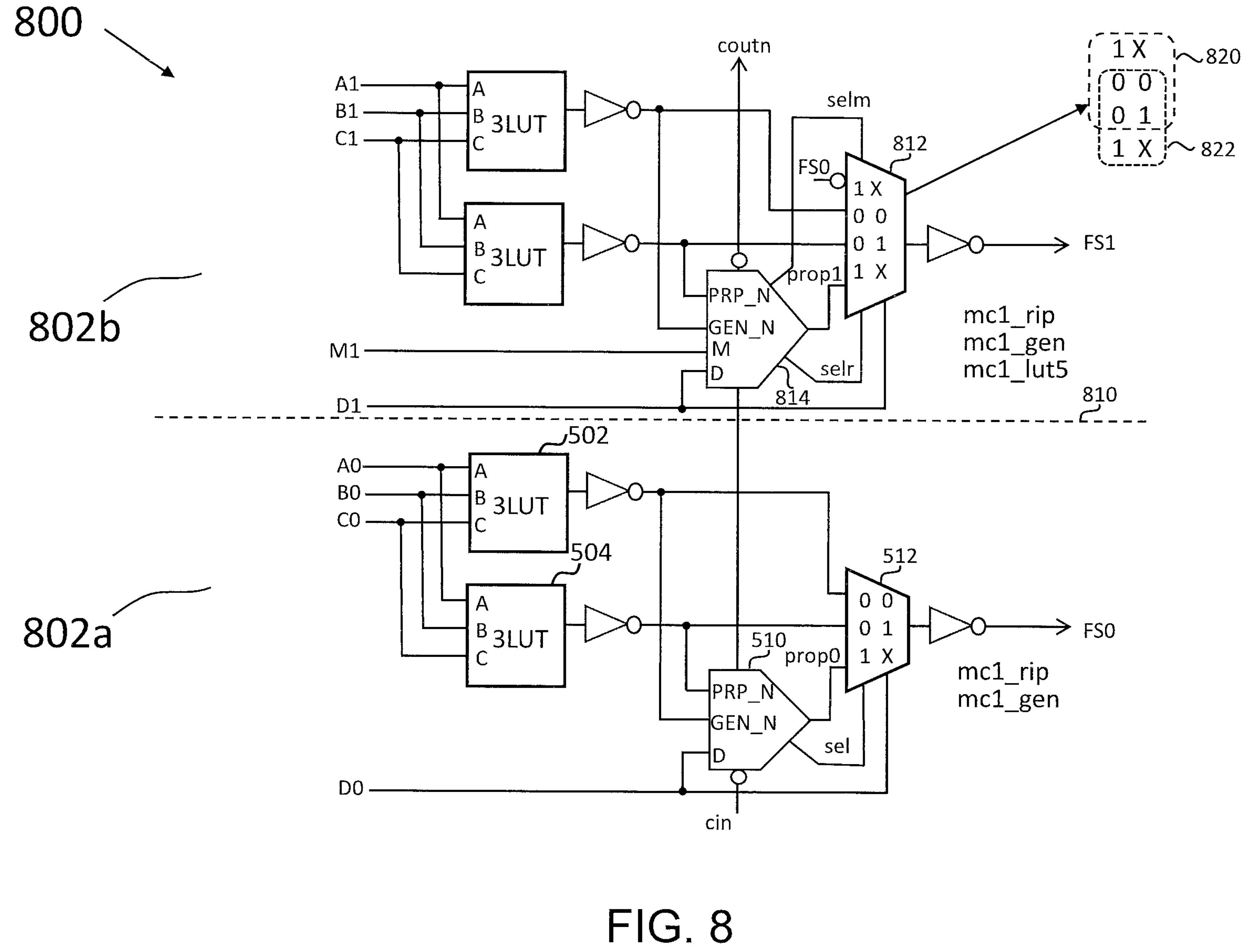
FIG. 8 illustrates an example slice for a PLD, according to some aspects of the disclosure.

FIG. 8 illustrates an example sub-block or slice 800 for a PLD, such as PLD 100, according to some aspects of the disclosure. In some embodiments, the slice 800 includes two combinatorial circuits 802*a* and 802*b*, that output FS0 and FS1, respectively. The combinatorial circuits 802*a*, 802*b* are functionally separated by line 810. The combinatorial circuits 802*a*, 802*b* can be can either be used independently and configured to received inputs A0-D0 and A1-D1, respectively, or configured so that an additional input (M1) is used to dynamically multiplex between their respective LUT outputs (shown as F and F0 at multiplexer 812) on output FS1.

FIG. 8 illustrates a slice 800 that offers the same functionality as a conventional slice, but without the drawback of added delay of certain output multiplexers and buffers used. Output FS0 is the same implementation as shown in FIG. 5 (combinatorial circuit 802*a* is the same implementation as combinatorial circuit 540). Output FS1 provides the same functionality as an FS1 output in a conventional slice (LUT4, ripple and LUT5 support), but without an added multiplexer and buffer downstream of a LUT4 output. In similar manner, LUT5 support and ripple mode are introduced in parallel with the last stage multiplexer 812 of the LUT4, increasing the multiplexer from a 2:1 mux (in a conventional slice) to a 4:1 mux. When FS1 is in LUT4 mode, selr and selm are both zero and inputs, FS0 and prop1 are not selected, and the 4:1 mux behaves as a simple 2:1 mux controlled by the D1 input. When ripple logic is enabled, selm is zero and selr will be responsive to cin and select prop1 as appropriate to for ripple functionality. When LUT5 mode is enabled, selr is zero and selm will be responsive to M1 and select FS0 as appropriate for LUT5 operation. Configuration bits mc1_rip, mc1_gen, and mc1_lut5 are illustrated for selecting the mode of operation of combinatorial circuits 802*a* and 802*b*. For example, configuration bits may set selr and selm for input to multiplexer 812 so that combinatorial circuit 802*b* (and therefore the corresponding logic block) is in LUT mode or ripple mode.

The combinatorial circuit 802*b* includes ripple circuit 814 and four-to-one multiplexer 812 as shown. The truth table shown in multiplexer 812 is expanded out for illustration. LUT5 mode and ripple mode are mutually exclusive so that configuration bits mc1_rip and mc1_lut5 would not be programmed to logic high at the same time. There are thus two truth tables 820 and 822 as indicated for the multiplexer 812. If configuration bit mc1_rip is logic high, the lower truth table 822 applies. If configuration bit mc1_lut5 is logic high, the upper truth table 820 applies.

Figure 9:
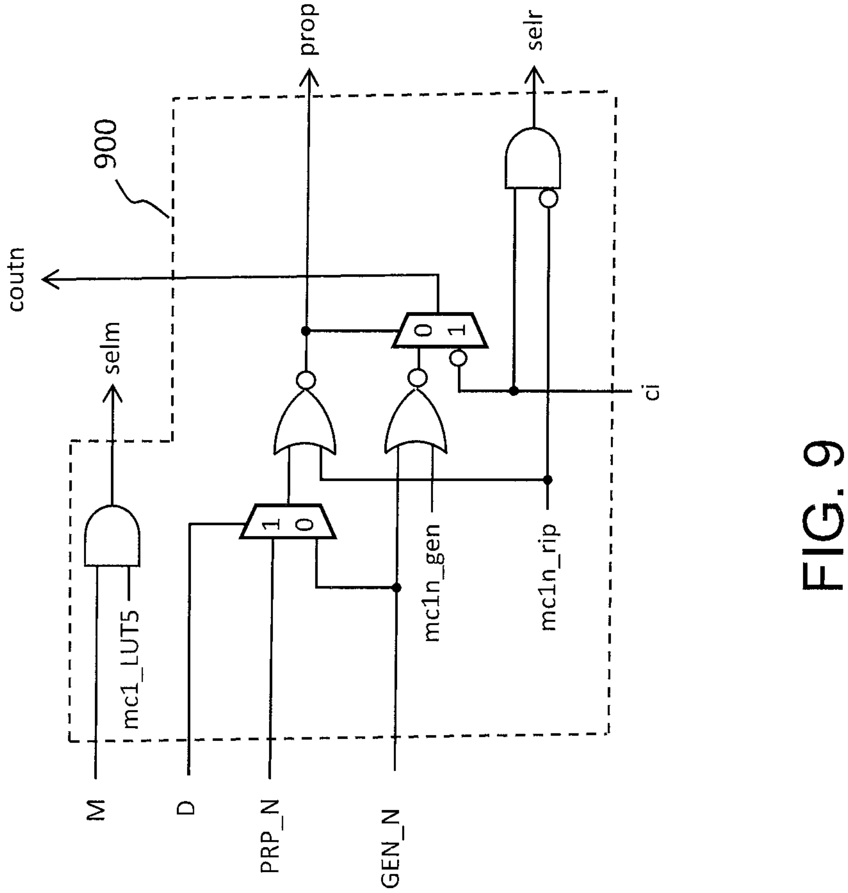
FIG. 9 illustrates an example embodiment of another ripple circuit, according to some aspects of the disclosure.

FIG. 9 illustrates an example embodiment of a ripple circuit 900, such as ripple circuit 814 in FIG. 8, according to some aspects of the disclosure. The ripple circuit 900 example here illustrates the use of configuration bits labeled as mc1_rip, mc1_gen, and mc1_lut5, which may represent binary control signals provided from bits stored in memory (e.g., registers or SRAM) (not shown).

Figure 10:
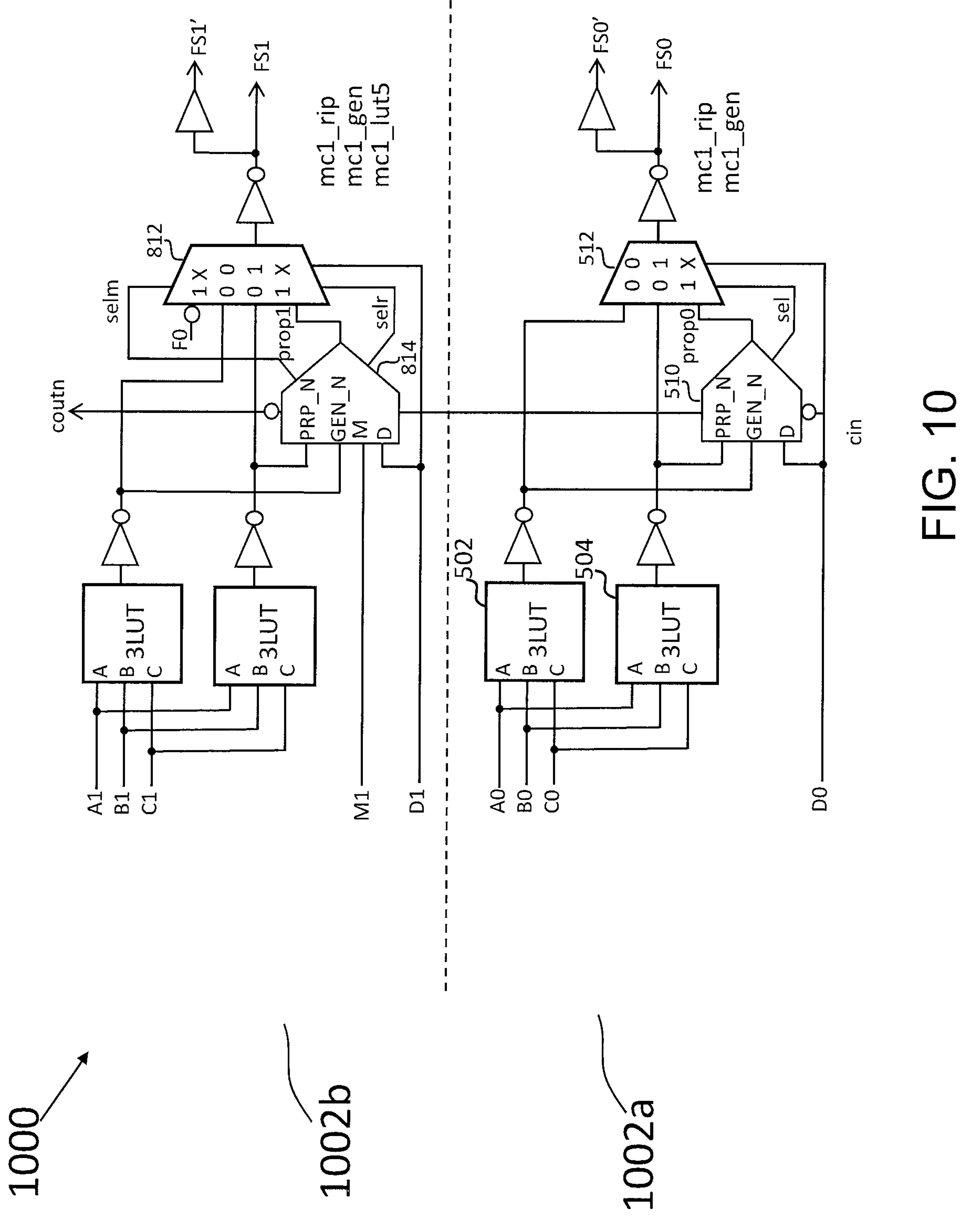
FIG. 10 illustrates another example slice for a PLD, according to some aspects of the disclosure.

FIG. 10 illustrates another example slice 1000 for a PLD, according to some aspects of the disclosure. FIG. 9 shows an example slice 1000 like that shown in FIG. 8 but provides a means for the hardware designer to favor certain destinations for higher performance. The FS0, FS1 outputs are used for speed-critical destinations. The FS0', FS1' outputs handle higher fanout loads. Both FS0 and FS0' outputs are functionally identical in all modes and therefore they can both be used in all modes. Both FS1 and FS1' outputs are functionally identical in all modes and therefore they can both be used in all modes. Routing then only needs to support two combinatorial outputs: FS0 plus FS0' and FS1 plus FS1'.

Figure 11:
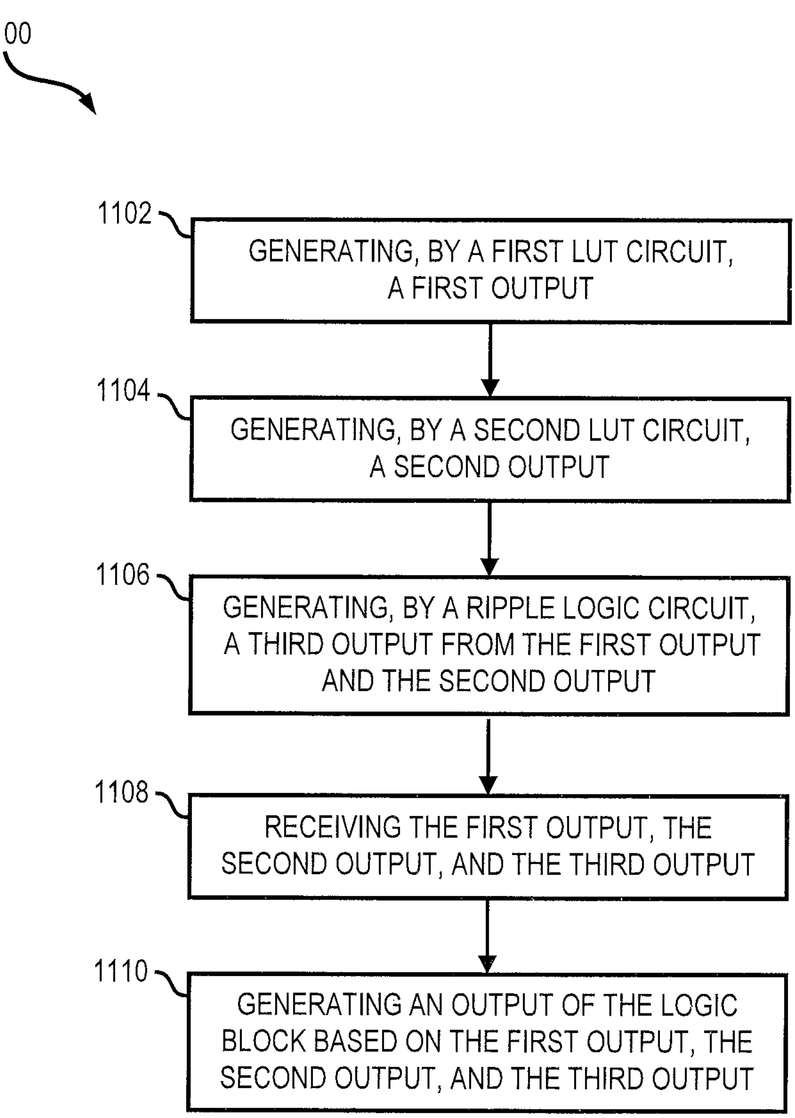
FIG. 11 is an example method of operating a logic block, according to some aspects of the disclosure.

FIG. 11 is an example method of operating a logic block, such as logic block 104 or 400, according to some aspects of the disclosure. The logic block may include a combinatorial circuit including a first LUT circuit, a second LUT circuit, a ripple logic circuit, and a three-to-one multiplexer circuit, as illustrated in FIGS. 4 and 5, for example. In step 1102, a first LUT circuit, such as the LUT circuit including the 3LUT 502 and the connected inverter in FIG. 5, generates a first output, such as the output signal 514. In step 1104, a second LUT circuit, such as the LUT circuit including the 3LUT 504 followed by the inverter in FIG. 5, generates a second output, such as the output signal 516. In step 1106, a third output is generated by a ripple logic circuit, such as the ripple logic circuit 510 in FIG. 5. In step 1108, the first output, the second output, and the third output are received, such as by the three-to-one multiplexer 512 in FIG. 5. In step 1110, an output of the logic block is generated based on the first output, the second output, and the third output. A multiplexer, such as the three-to-one multiplexer 512 in FIG. 5, may generate the output of the logic block by selectively providing one of the first output, the second output, and the third output. The first, second, and third outputs may be simultaneously received by a multiplexer, thereby eliminating intermediate components, such as an intermediate multiplexer, as used in conventional logic blocks, and providing related improvements in speed and routing cost.

Persons skilled in the art will recognize that the apparatus, systems, and methods described above can be modified in various ways. Accordingly, persons of ordinary skill in the art will appreciate that the embodiments encompassed by the present disclosure are not limited to the particular exemplary embodiments described above. In that regard, although illustrative embodiments have been shown and described, a wide range of modification, change, and substitution is contemplated in the foregoing disclosure. It is understood that such variations may be made to the foregoing without departing from the scope of the present disclosure. Accordingly, it is appropriate that the appended claims be construed broadly and in a manner consistent with the present disclosure.

What is claimed is:

1. A programmable logic device (PLD) comprising:
a logic block comprising:
a first lookup table (LUT) circuit configured to generate a first output;
a second LUT circuit configured to generate a second output;
a ripple logic circuit configured to receive the first output and the second output and generate a third output;
a three-to-one multiplexer circuit configured to receive the first output, the second output, and the third output and selectively produce an output of the logic block; and
wherein the ripple logic circuit is further configured to generate a select signal for the three-to-one multiplexer circuit, and wherein the select signal determines a mode of the logic block as a LUT mode or a ripple mode.

2. The PLD of claim 1, wherein the first output, the second output, and the third output are simultaneously received by the three-to-one multiplexer circuit.

3. The PLD of claim 1, wherein the first LUT circuit comprises a first three-input LUT (3LUT) in series with a first inverter, wherein the first output is an output of the first inverter, wherein the second LUT circuit comprises a second 3LUT in series with a second inverter, and wherein the second output is an output of the second inverter.

4. The PLD of claim 3, wherein the three-to-one multiplexer circuit selectively implements a four-input LUT (4LUT) mode from the first 3LUT and second 3LUT by selecting one of the first output and the second output.

5. The PLD of claim 3, wherein the ripple logic circuit is further configured to receive a carry in signal from one logic block and generate a carry out signal for another logic block.

6. The PLD of claim 5, wherein the ripple logic circuit is further configured to generate a select signal for the three-to-one multiplexer circuit.

7. The PLD of claim 3, further comprising:
a buffer configured to receive the output of the logic block and generate a fanout output.

8. A method of operating the PLD of claim 1, comprising:
generating, by the first LUT circuit, the first output;
generating, by the second LUT circuit, the second output;
generating, by the ripple logic circuit, the third output from the first output and the second output;
receiving, by the three-to-one multiplexer circuit, the first output, the second output, and the third output; and
producing, by the three-to-one multiplexer circuit, the output of the logic block based on the first output, the second output, and the third output.

9. A method of programming the PLD of claim 1, the method comprising:
generating configuration data to configure physical components of the PLD in accordance with a synthesized design; and
programming the PLD with the configuration data.

10. The PLD of claim 1, further comprising:
a second logic block comprising:
a second multiplexer circuit configured to selectively implement a second 4LUT mode, a 5LUT mode, or a second ripple mode functionality.

11. A method of operating a logic block within a programmable logic device (PLD), the method comprising:
generating, by a first lookup table (LUT) circuit, a first output;
generating, by a second LUT circuit, a second output;
generating, by a ripple logic circuit, a third output from the first output and the second output;
receiving the first output, the second output, and the third output;
generating an output of the logic block based on the first output, the second output, and the third output, wherein the receiving and the generating are performed by a three-to-one multiplexer circuit; and
generating, by the ripple logic circuit, a select signal for the three-to-one multiplexer circuit, wherein the select signal determines a mode of the logic block as a LUT mode or a ripple mode.

12. The method of claim 11, wherein the first output, the second output, and the third output are simultaneously received by the three-to-one multiplexer circuit.

13. The method of claim 11, wherein the first LUT circuit comprises a first three-input LUT (3LUT) in series with a first inverter, wherein the first output is an output of the first inverter, wherein the second LUT circuit comprises a second 3LUT in series with a second inverter, and wherein the second output is an output of the second inverter.

14. The method of claim 13, further comprising:

receiving, by the ripple logic circuit, a carry in signal from one logic block; and generating, by the ripple logic circuit, a carry out signal for another logic block.

15. The method of claim 13, further comprising:

generating a fanout output, by a buffer, from the output of the logic block.

16. The method of claim 11, wherein a programmable logic device (PLD) comprises the logic block, and wherein the method further comprises:

generating configuration data to configure physical components of the PLD, including the logic block, in accordance with a synthesized design; and programming the PLD with the configuration data.

17. A method of programming a programmable logic device (PLD), the PLD comprising:

a plurality of programmable logic blocks (PLBs), wherein each of the plurality of PLBs comprises:

a first lookup table (LUT) circuit configured to generate a first output;

a second LUT circuit configured to generate a second output;

a ripple logic circuit configured to receive the first output and the second output and generate a third output; and a multiplexer circuit configured to selectively place the PLB in a LUT mode or a ripple mode by selecting one of the first output, the second output, and the third output as an output of the PLB, wherein the ripple logic circuit is further configured to generate a select signal for the multiplexer circuit to place the PLB in the LUT mode or the ripple mode, the method comprising:

generating configuration data to configure physical components of the PLD in accordance with a synthesized design comprising, for each PLB, one of the LUT mode or the ripple mode; and programming the PLD with the configuration data.

18. The method of claim 17, wherein each PLB comprises a generate register and a ripple register coupled to the ripple logic circuit, and wherein the selected mode from among the LUT mode or the ripple mode is determined by the values of the ripple register and the generate register established during the programming of the PLD.

19. The method of claim 17, wherein the first LUT circuit comprises a first three-input LUT (3LUT) in series with a first inverter, wherein the first output is an output of the first inverter, wherein the second LUT circuit comprises a second 3LUT in series with a second inverter, and wherein the second output is an output of the second inverter.

20. The method of claim 19, wherein the ripple logic circuit is further configured to receive a carry in signal from one logic block and generate a carry out signal for another logic block.

* * * * *